(12) United States Patent
Chen

(10) Patent No.: US 9,644,830 B2
(45) Date of Patent: May 9, 2017

(54) APPLICATION-SPECIFIC LED MODULE AND ASSOCIATED LED POINT SOURCE LUMINAIRES

(71) Applicant: Sunlite Science & Technology, Inc., Lawrence, KS (US)

(72) Inventor: Jeff Chen, Lawrence, KS (US)

(73) Assignee: Sunlite Science & Technology, Inc., Lawrence, KS (US)

( * ) Notice: Subject to any disclaimer, the term of this patent is extended or adjusted under 35 U.S.C. 154(b) by 409 days.

(21) Appl. No.: 14/172,510

(22) Filed: Feb. 4, 2014

(65) Prior Publication Data

US 2014/0226332 A1 Aug. 14, 2014

Related U.S. Application Data

(60) Provisional application No. 61/760,497, filed on Feb. 4, 2013.

(51) Int. Cl.
*F21S 4/00* (2016.01)
*F21V 29/00* (2015.01)
(Continued)

(52) U.S. Cl.
CPC ............ *F21V 29/2293* (2013.01); *F21K 9/20* (2016.08); *F21V 29/83* (2015.01); *F21S 2/00* (2013.01);
(Continued)

(58) Field of Classification Search
CPC . F21K 9/00; F21K 9/30; F21V 29/004; F21V 15/01; F21V 21/005; F21V 23/005
(Continued)

(56) References Cited

U.S. PATENT DOCUMENTS 4,205,223 A * 5/1980 Cole ..................... H02H 5/043
219/212
4,357,648 A 11/1982 Nelson
(Continued)

FOREIGN PATENT DOCUMENTS

JP 200964781 A 3/2009

OTHER PUBLICATIONS

International Search Report and Written Opinion issued in PCT/US2014/014664 on May 28, 2014, 13 pp.

*Primary Examiner* — Bryon T Gyllstrom
(74) *Attorney, Agent, or Firm* — Erise IP, P.A.

(57) ABSTRACT

LED downlight and other point source luminaires contain one or more Application-Specific LED modules with integrated optical, mechanical, and heat dissipation systems; a fluted extruded metal housing acts as a heat sink as well as the luminaire housing containing the AS-LED module(s) or receiving a rotatable spherical housing that contains the AS-LED module, printed circuit board units, and wires; mounting brackets; and a remote LED driver. The extruded aluminum housing (and heat sink) may be comprised of a single cylinder or multiple concentric cylinders. The heat dissipation base of the AS-LED module can be any shape and size dependent on the type of LED luminaire the AS-LED module is designed for. The LED luminaires have a short thermal path, including just one electrical/thermal insulation layer between the LED chips and the housing, and one optical lens system between the LED chips and the surrounding ambient air.

27 Claims, 11 Drawing Sheets

(51) Int. Cl.
  *F21V 29/83* (2015.01)
  *F21K 9/20* (2016.01)
  *F21S 2/00* (2016.01)
  *F21S 8/02* (2006.01)
  *F21V 23/00* (2015.01)
  *F21Y 115/10* (2016.01)

(52) U.S. Cl.
  CPC ............ *F21S 8/026* (2013.01); *F21V 23/008* (2013.01); *F21Y 2115/10* (2016.08); *H01L 2224/45144* (2013.01); *H01L 2224/48091* (2013.01)

(58) Field of Classification Search
  USPC .................................................. 362/249.02
  See application file for complete search history.

(56) References Cited

U.S. PATENT DOCUMENTS

| | | | |
|---|---|---|---|
| 4,495,550 A | 1/1985 | Visciano | |
| 4,701,835 A | 10/1987 | Campagnuolo et al. | |
| 4,823,242 A | 4/1989 | Maglica et al. | |
| 5,043,854 A | 8/1991 | Gammache | |
| 5,588,739 A | 12/1996 | Nakao | |
| 5,632,551 A | 5/1997 | Roney et al. | |
| 6,199,997 B1 | 3/2001 | Outsen et al. | |
| 6,305,818 B1 | 10/2001 | Lebens et al. | |
| 6,402,339 B1 | 6/2002 | Mukogawa et al. | |
| RE38,014 E | 3/2003 | Bieberstein | |
| 6,652,117 B2* | 11/2003 | Tsai | F21S 2/00 362/217.12 |
| 6,737,811 B2 | 5/2004 | Zhang et al. | |
| 6,802,622 B2 | 10/2004 | Hsien | |
| 7,618,155 B2 | 11/2009 | Chen | |
| 8,044,412 B2* | 10/2011 | Murphy | H01L 23/60 257/81 |
| 8,157,420 B2* | 4/2012 | Song | F21V 15/013 362/218 |
| 8,157,422 B2* | 4/2012 | Paik | F21K 9/23 362/249.02 |
| 8,220,970 B1* | 7/2012 | Khazi | F21V 29/004 362/294 |
| 8,362,677 B1* | 1/2013 | Morejon | F21V 29/004 313/46 |
| 2003/0151915 A1 | 8/2003 | Mele | |
| 2004/0130894 A1 | 7/2004 | Galli | |
| 2005/0088843 A1 | 4/2005 | Chapman | |
| 2005/0157492 A1 | 7/2005 | Chiu | |
| 2006/0092629 A1 | 5/2006 | Chen | |
| 2006/0145180 A1* | 7/2006 | Galli | F21L 4/027 257/99 |
| 2008/0068839 A1 | 3/2008 | Matheson | |
| 2008/0274641 A1* | 11/2008 | Weber | F21V 23/06 439/541.5 |
| 2009/0003009 A1 | 1/2009 | Tessnow et al. | |
| 2009/0009997 A1* | 1/2009 | Sanfilippo | F21S 2/005 362/244 |
| 2009/0097262 A1* | 4/2009 | Zhang | F21S 8/026 362/364 |
| 2010/0053950 A1* | 3/2010 | Higuchi | F21S 8/026 362/234 |
| 2010/0061108 A1* | 3/2010 | Zhang | F21V 29/004 362/364 |
| 2010/0072921 A1* | 3/2010 | Weatherley | F21K 9/00 315/297 |
| 2010/0103666 A1* | 4/2010 | Chang | F21V 29/004 362/234 |
| 2010/0259919 A1* | 10/2010 | Khazi | F21S 8/026 362/84 |
| 2011/0133622 A1* | 6/2011 | Mo | F21K 9/00 313/46 |
| 2011/0310599 A1 | 12/2011 | Eberhardt | |
| 2012/0069545 A1* | 3/2012 | Choi | F21V 3/00 362/84 |
| 2012/0106176 A1* | 5/2012 | Lopez | F21K 9/00 362/382 |
| 2013/0003346 A1 | 1/2013 | Letoquin et al. | |

* cited by examiner

APPLICATION-SPECIFIC LED MODULE AND ASSOCIATED LED POINT SOURCE LUMINAIRES

RELATED APPLICATIONS

This application claims priority to provisional application No. 61/760,497, filed Feb. 4, 2013 and titled "LUMINAIRE", and which is incorporated by reference herewith in its entirety.

TECHNICAL FIELD

This invention relates generally to the field of light emitting diode (hereafter, LED) luminaires, specifically, to thermally efficient and highly integrated Application-Specific LED Modules (hereafter, AS-LED modules). More specifically, this invention relates to highly integrated LED downlight and other point source luminaires employing the use of said AS-LED modules.

BACKGROUND ART

It is known that prior high power LEDs comprising one or more LED chips, that are mounted onto a submount such as a metal core printed circuit board (hereafter, MCPCB) or ceramic, which contain typically at least one electrical insulation layer—0.1 mm in thickness, and one or more optical lens systems covering the LED chip(s). These high power LED packages are then adhered to another MCPCB with another 0.1 mm electrical insulation layer, which is then fastened to a heat sink and Edison style screw-in base and typically contained beneath an additional plastic or glass lens.

It is also known that prior LED modules are typically made with packaged LEDs adhered to another MCPCB, which is then fastened to a cast metal heat sink, with an additional optical lens system attached to the heat sink. These LED modules are then mounted into additional housings for their designed purpose and typically have at least one more additional lens or reflector.

It is also known that prior LED downlights are typically either made with the above Edison style screw-in LED luminaire in a traditional can fixture, or made with the above high power LED modules fastened mounted in a downlight can fixture.

SUMMARY OF THE INVENTION

In one aspect, a luminaire module is described including a housing formed of extruded metal that is fluted and cylindrical. An application-specific light emitting diode (AS-LED) module is coupled to the housing and includes first and second sets of contact pads. The luminaire module further includes a printed circuit board having a first side including two sets of contact elements coupling to a respective one of the first and second sets of pads, and a second side including two wires coupled thereto, one of the wires may have a thermal fuse integrated therein. The second side may include a shunt protection device. Additionally, the luminaire module may include a decorative trim inserted between the housing and the AS-LED module, a bracket for ceiling mount and a remote LED driver.

DESCRIPTION OF EMBODIMENTS

Figure 1:
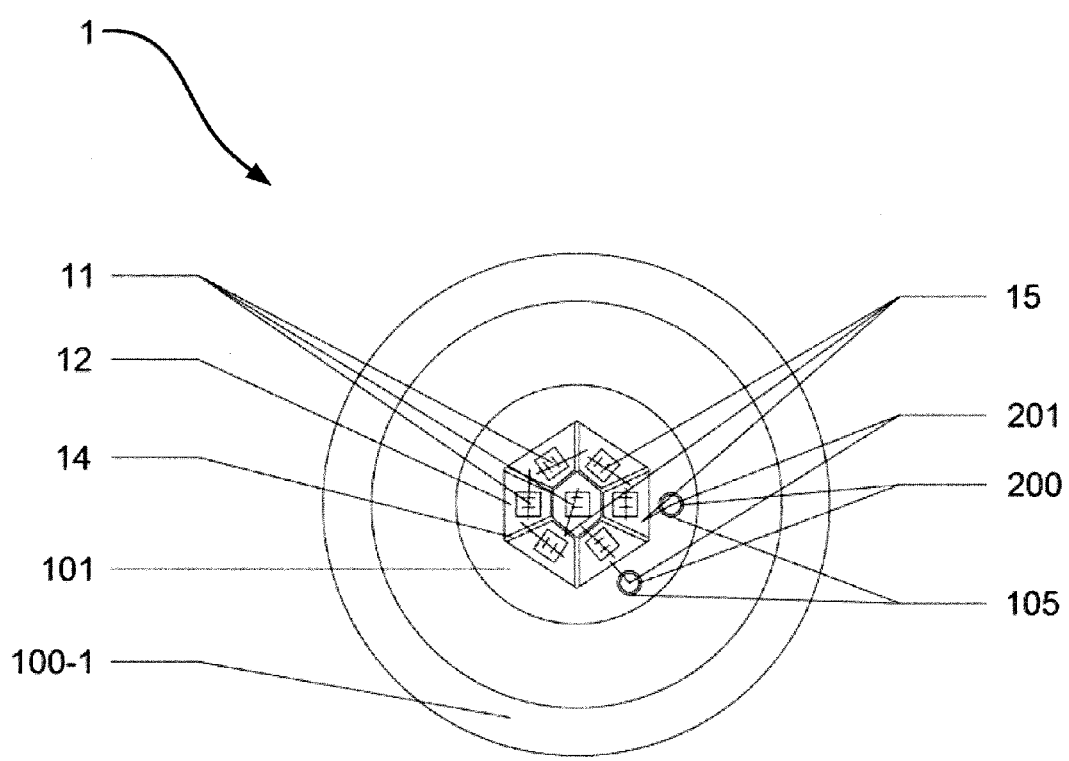
FIG. 1 shows an exemplary top view layout of an AS-LED module, including a plurality of LED chips [11], in one embodiment.

The added insulation layers and the additional optical lens system(s) reduce the thermal performance and the light output of the prior LED point source luminaires. In addition, the prior art LED modules cannot be easily replaced. Therefore, an objective of the embodiments herein is to design LED modules and luminaires that eliminate unnecessary electrical insulating layers, reflectors, and optical lens systems by integrating the optical, mechanical, and heat dissipation systems into a LED Module. This integration allows the heat dissipation of the AS-LED Module through the heat dissipating design of the base and trim of the module and the extruded aluminum heat sink housing—providing two adjustable points for the heat dissipation requirements of each different LED configuration. This integration subsequently allows simplified manufacturing and the LED module to be replaceable.

Another objective of the embodiments herein is to design LED downlight and other point source luminaires, with the above integrated AS-LED modules, that also integrate the heat sink and can housing so that the housing, which acts now as the heat sink, no longer includes two separate parts in conjunction. Therefore, the housing may be manufactured from a single piece of fluted extruded aluminum and will allow for the use of a simple plastic bracket for ceiling mount. This integration allows the smallest can light for its efficacy to be invented. The cast aluminum of prior LED down light luminaires has a lower thermal conductivity, due to the impurities and the porosity, then extruded aluminum. Cast aluminum is typically finished by paint and compared to the anodized finish of extruded aluminum; paint has a lower thermal conductivity.

Another objective of the embodiments herein is to design an angle-adjustable LED downlight luminaires, with the above integrated AS-LED modules, that allows the rotatable heat sink housing of the AS-LED module to rotate while still remaining in contact with the can housing, so that the can housing also acts as an additional heat sink.

The described embodiments herein implement the integration of the optical, mechanical, and heat dissipation systems to the LED module by designing an AS-LED module that integrates a single optical lens system for the final LED luminaires into the LED module, a heat dissipation system that utilizes a silicon submount for mounting LED chips on one side and for contacting the heat dissipation base on the other side, and a mechanical system that introduces just one electrical insulating layer—around 0.0001 mm, providing a one thousand times reduction over that of the prior high power LED modules,—between the LED chips and the final luminaires' heat sink.

The described embodiments herein provide an AS-LED module, wherein the, the LED chips may be mounted to the isolated metal area of a silicon submount, through the use of an eutectic gold/tin alloy system or solder paste, by thermal conductive paste, or by thermal and electrical conductive paste. The silicon submount is mounted to the center flat surface at the bottom of the recessed concave heat dissipation base. The heat dissipation base further includes a raised surrounding step above the bottom flat surface, to receive a glass lens in a shape determined by the desired output beam of light, a recessed or non-recessed backside, to receive a printed circuit board unit (hereafter, PCB), and one or more through-holes, to allow metal pins to branch from the front surface to the back. The LED chips are inter-connected in series and/or parallel through wire-bonding with final wires bonded to the metal pins that are soldered to the PCB, or the LED chips may be flip-chip LED chips, eliminating the need for wire bonding. The single optical lens system is preferably formed by having a glass lens directly contacting a thin layer of curable silicone gel dispensed on the LED chips. Phosphors may be dispensed on the LED chips or on the glass lens. Comparing to a silicone lens, a glass lens has a higher thermal conductivity and does not require additional protection from scratching or for fire-rating. The heat dissipation base may have external threads. The heat dissipation base may have a wider surrounding edge extended in circumference at the bottom of the reflector. The heat dissipation base may have both a surrounding edge extended in circumference at the bottom of the reflector and external threads above and/or below the wider surrounding edge for coupling with—including but not limited to—heat sinks, reflectors, and diffusers/light manipulators, like optical fibers.

One configuration of LED luminaire utilizes the said AS-LED module with exterior threads, a fluted extruded metal cylindrical housing with internal threads to receive the AS-LED module, a PCB subassembly with thermal fuse and optionally a shunt protection device, a decorative trim, a bracket (plastic or metal) for ceiling mount, and a remote LED driver. The said fluted cylindrical housing may have multiple concentric cylinders with the inner cylinder receiving the AS-LED module. The said inner cylinder may be either at the same level as the outer cylinder or may be recessed.

Another configuration utilizes the said AS-LED module with exterior threads, a spherical housing with internal threads to receive the AS-LED module, a PCB subassembly with thermal fuse and shunt protection device, a fluted extruded metal cylindrical housing with a concave recess to receive the spherical housing, a decorative trim which also locks the spherical housing in place after it rotates to the desired angle, a bracket (plastic or metal) for ceiling mount, and a remote LED driver.

The said bracket for ceiling mount contains flexible prongs that will apply tension to hold the lightweight luminaire once the bracket and the luminaire are in place as well as flexible prongs that support the bracket against the ceiling plane when the luminaire has been installed. The said cylindrical housings may have multiple vents cut in line with the fluted extrusions. The cylindrical housings may receive up to one AS-LED module on each end. The said cylindrical housing's flutes at intervals form flutes that act as a tongue and flutes that act as a groove for a tongue and groove joint to be made between two or more luminaires to shape multiple luminaires into whatever shape is desired. The said cylindrical housing may have legs coming out from the side to be mounted to wall or ground. The said cylindrical housing may have a sealed cap covering just the inner cylinder or the entire back of the housing when a second AS-LED is not being used—this cap may be utilized for anything from fire-rating, for a pendent wire base, for wall mounted base, to a stake for landscape lighting. The AS-LED module may have an additional sealed glass lens connected to the modules reflector and located above the original lens. The AS-LED module may be sealed together with the PCB subassembly for water proofing.

These luminaires may then be installed with a remote LED driver utilizing standard National Electrician's Code (hereafter, NEC) installation of connection wires and wire connectors. The wires of the first assembled luminaire would be attached to the remote LED driver and to the second assembled luminaire. The second luminaire has wires attached to the first assembled luminaire and the third assembled luminaire. And so on, until the last luminaire has wires attached to the second to last assembled luminaire and the remote LED driver. The remote LED driver is preferably housed in a standard NEC approved switch box to minimize the power loss on the DC wires by placing the remote LED driver closer to the fully assembled luminaires.

The said configurations can be designed in several ways, including but not limited to, two or more housings jointed together to form a wall sconce, a housing with stake end cap to form a landscape light, single housings hanging as pendants on their own or in groupings, multiple housings jointed together in clusters or to form shapes to be hung as higher powered/high voltage pendant fixtures, and multiple housings assembled at different angles to form a higher powered/high voltage street light fixture.

FIG. 1 shows an exemplary top view layout of an AS-LED module [1], including a plurality of LED chips [11], in one embodiment. AS-LED module [1] is depicted having seven LED chips [11] which are mounted on an isolated metal surface [12] of a silicon submount [14]. Although illustrated having seven LED chips [11], it will be appreciated that more or fewer LED chips may be included without departing from the scope hereof. For example, AS-LED module may have only a single LED chip [11]. Silicon submount [14] is mounted on a flat area [101] of a heat dissipation base [100-1]. LED chips [11] are interconnected in series by gold wires [15] and are then wire-bonded to surface [201] of the metal pins [200] which branch from the front side of the heat dissipation base [100-1] to the back side via holes [105].

Figure 2:
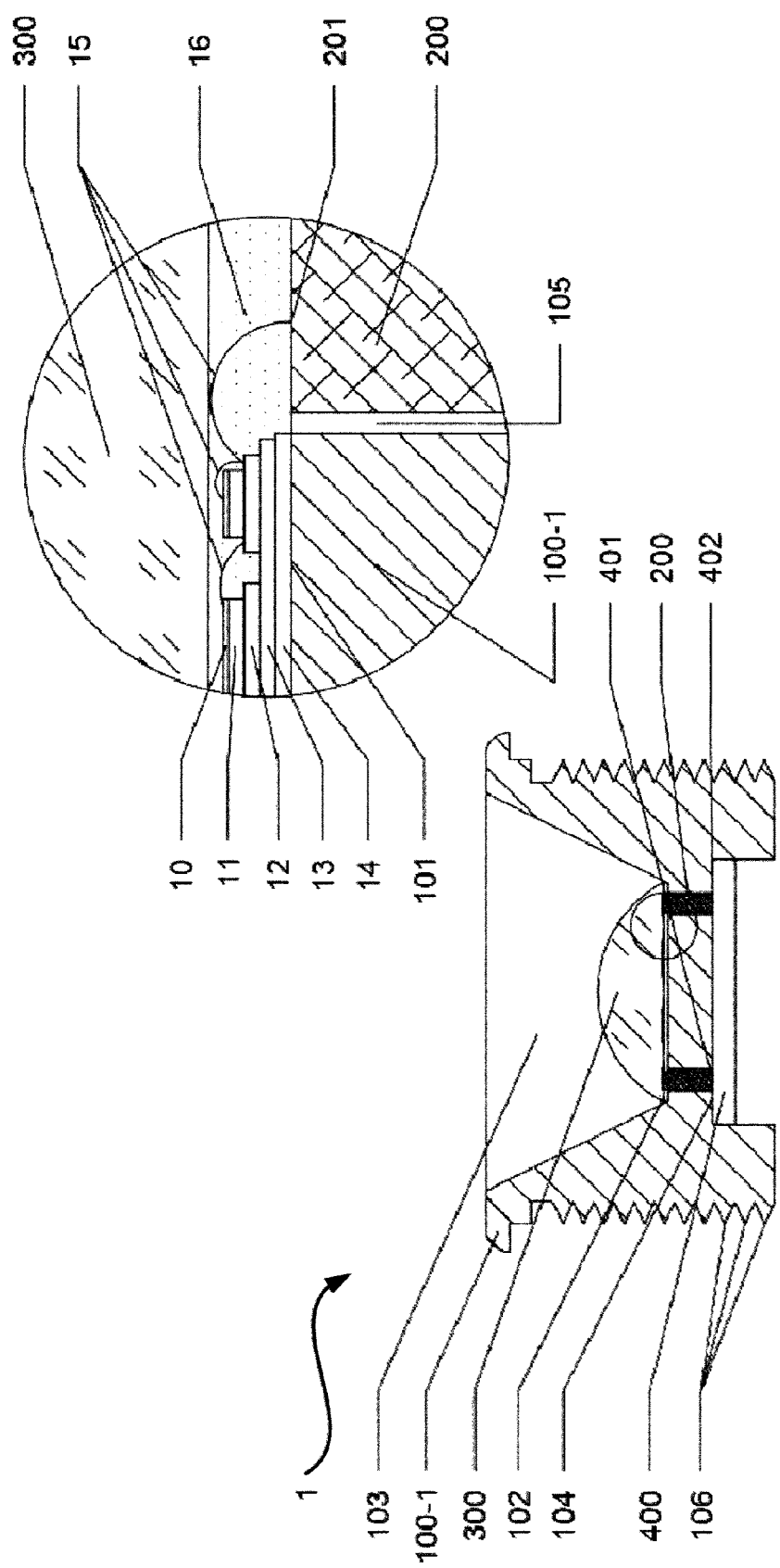
FIG. 2 shows an exemplary cross-section view of AS-LED module, and a more detailed portion thereof.

FIG. 2 shows an exemplary cross-section view of AS-LED module [1], and a more detailed portion thereof. LED chips [11] are mounted on the isolated metal surface [12] of the silicon submount [14], which is then mounted on the flat area [101] of the heat dissipation base [100-1]. LED chips [11] are interconnected in series and/or in parallel by gold wires [15] and are then wire-bonded to surface [201] of metal pins [200] which are electrically isolated from heat dissipation base [100-1] via an electrical insulation layer [13]. Electrical insulation layer [13] is, for example, around 0.0001 mm thick (but may be thicker or thinner without departing from the scope hereof). Phosphors [10] are dispensed on the LED chips [11]. A glass lens [300] sits on the step [102] on the interior surface of the heat dissipation base [100-1]. Optical material [16] fills the space beneath glass lens [300] and LED chips [11]. Both the concave surface [103] and the metal surface [12] are utilized to reflect light. PCB [400] is attached to the flat surface [104] and has two contacting pads [401 and 402] for soldering the metal pins [200] to. There are optional threads [106] on the exterior of the heat dissipation base [100-1].

Figure 3:
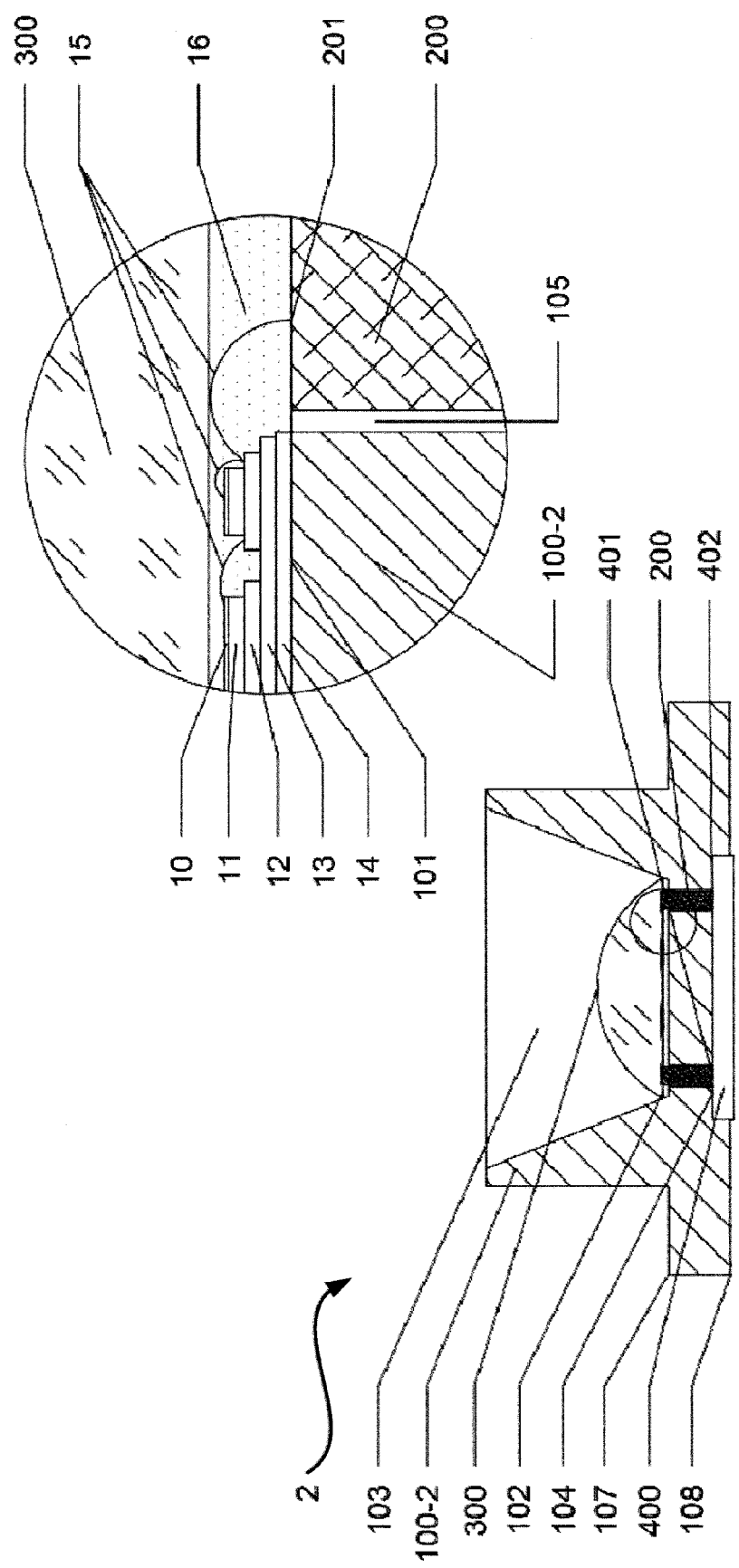
FIG. 3 shows a cross-section view of an exemplary AS-LED module, including a more detailed portion thereof, in another embodiment.

FIG. 3 shows a cross-section view of an exemplary AS-LED module [2] including a more detailed portion thereof, in another embodiment. Single or multiple LED chips [11] are mounted on the isolated metal surface [12] of a silicon submount [14], which is mounted onto the flat surface [101] of heat dissipation base [100-2]. The electrical insulating layer [13] is very thin. For example, the electrical insulating layer [13] may be comprised of dielectric thin film such as $SiO_2$, or $Si_3N_4$. The thickness of the electrical insulating layer [13] is for example around 100 nm.

The LED chips [11] are interconnected in series and/or in parallel by gold wires [15] and are then wire bonded to the surface [201] of the metal pins [200] passing through the holes [105] in the heat dissipation base [100-2]. Phosphors [10] are dispensed on the LED chips [11]. A glass lens [300] is coupled on the step [102] on the interior surface of the heat dissipation base [100-2]. Optical material [16] fills the space beneath the glass lens [300] and the LED chips [11]. The heat dissipation base [100] further includes a recessed concave reflector [103] and a wider surrounding edge with front surface [107] and back surface [108]. Although not illustrated, heat dissipation base [100-2] may further include threads (similar to those shown in FIG. 2). The threaded portion may be of similar circumference to the wider surrounding edge portion, or may include a different circumference than wider surrounding edge portion. PCB [400] is attached to the flat surface [104] and has two contacting pads [401 and 402] for soldering the metal pins [200] to.

Figure 4:
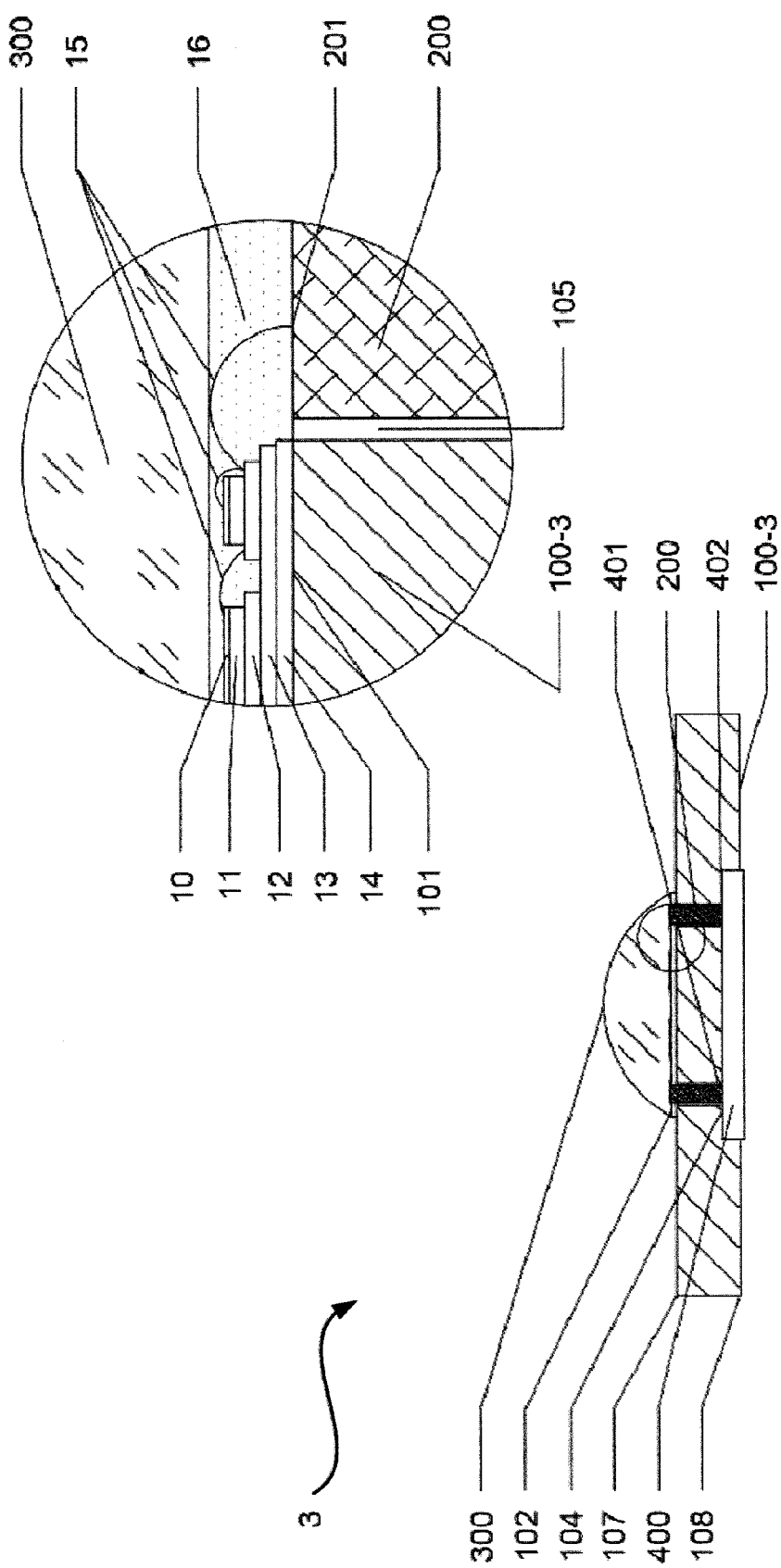
FIG. 4 shows a cross-section view of an exemplary AS-LED module, including a more detailed portion thereof, in another embodiment.

FIG. 4 shows a cross-section view of an exemplary AS-LED module [3] including a more detailed portion thereof, in another embodiment. Single or multiple LED chips [11] are mounted on the isolated metal surface [12] of a silicon submount [14], which is mounted onto the flat surface [101] of a heat dissipation base [100-3]. The electrical insulating layer [13] is very thin. The LED chips [11] are interconnected in series and/or in parallel by gold wires [15] and are then wire bonded to the surface [201] of the metal pins [200] passing through the holes [105] in the heat dissipation base [100-3]. Phosphors [10] are dispensed on the LED chips [11]. The glass lens [300] sits on the step [102] on the interior surface of the heat dissipation base [100-3]. Optical material [16] fills the space beneath the glass lens [300] and the LED chips [11]. The heat dissipation base [100-3] further includes a wider surrounding edge with front surface [107] and back surface [108]. PCB [400] is attached to the flat surface [104] and has two contacting pads [401 and 402] for soldering the metal pins [200] to.

The heat dissipation bases described herein provide numerous advantages over previous systems. For example, utilizing a heat sink including a recessed reflector combines an optical system with heat dissipation. Accordingly, in certain embodiments, a secondary optical lens is not needed. Furthermore, utilizing a wider surrounding edge provides a larger area for contact between the AS LED module and the lighting fixture such that the heat transfer surface is increased and the heat can be dissipated from the module to the fixture more effectively. Moreover, utilizing the reflector and/or wider surrounding edge increases the heat dissipation mass of the base, thereby increasing the effectiveness of the heat transfer.

Figure 5A:
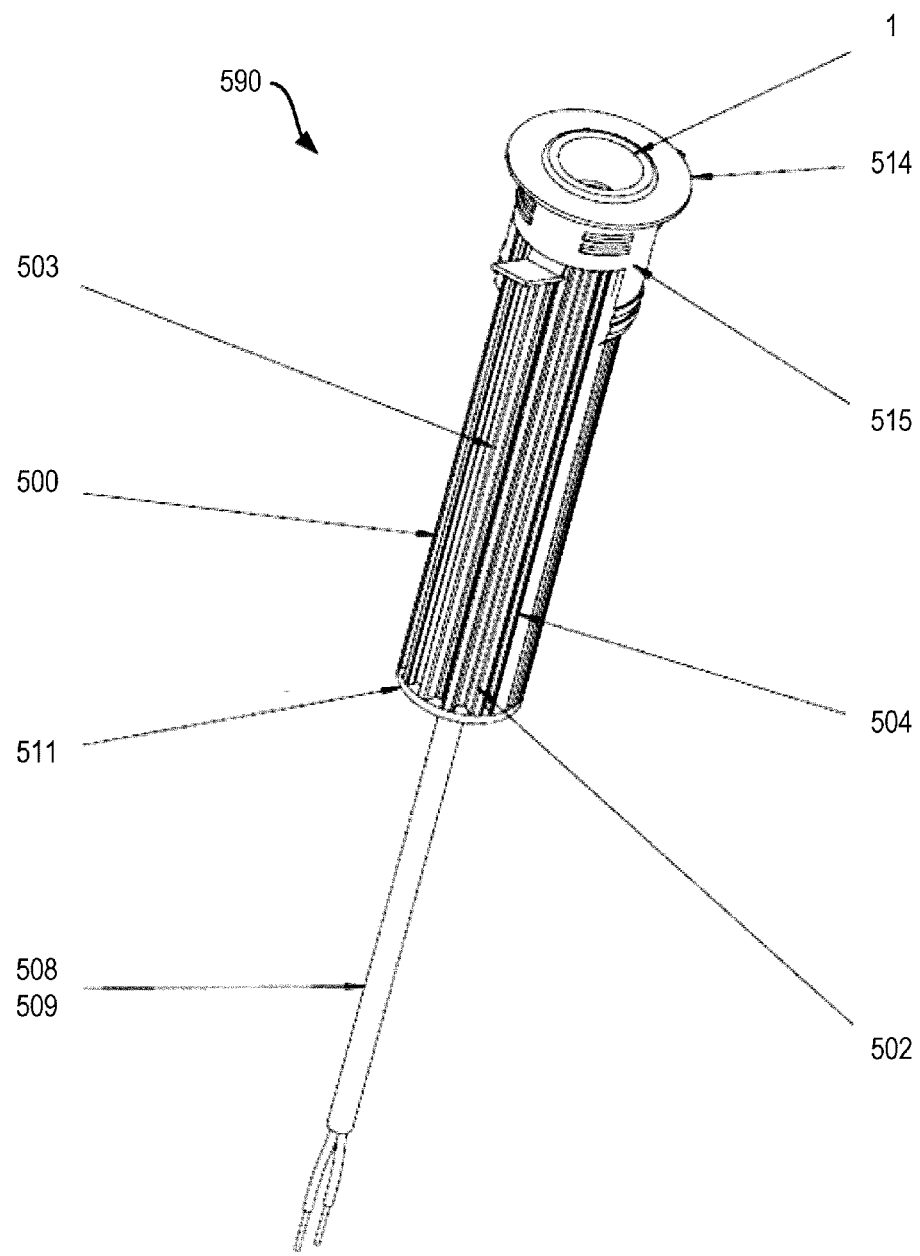
FIGS. 5A and 5B are perspective and exploded views of an exemplary LED downlight Luminaire, respectively.
Figure 5B:
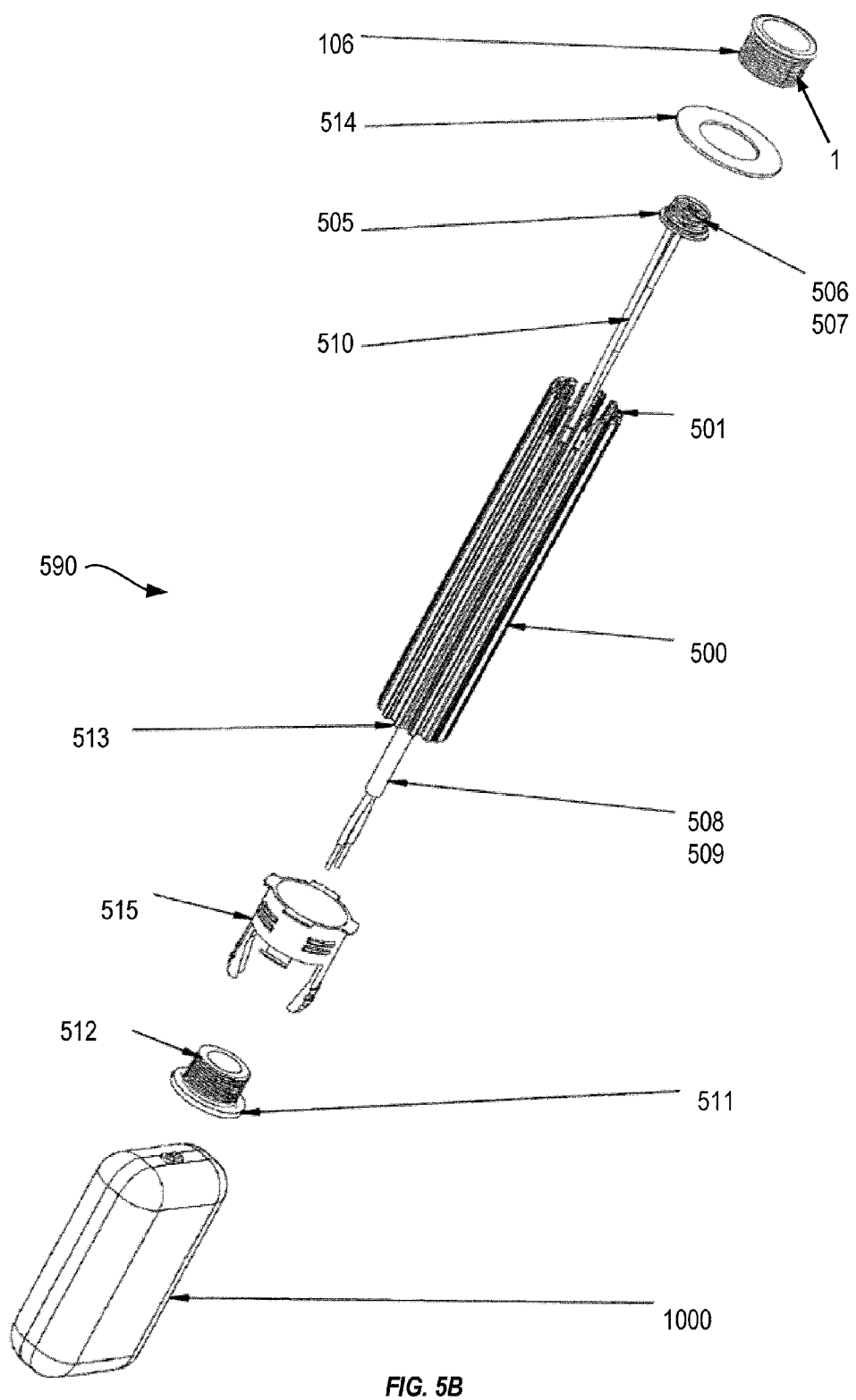

FIGS. 5A and 5B illustrate one example of a LED downlight luminaire module [590], in one embodiment, in perspective and exploded views, respectively. External threads [106] on the AS-LED module [1] complement internal threads [501] of a cylindrical housing [500] of luminaire module [590]. Cylindrical housing [500] is fluted [502], extruded metal, to increase the heat sink's radiation. Optionally, cylindrical housing [500] can have a pattern of flutes [502] that can act as a tongue [503] and groove [504] joint system between multiple luminaire module housings. Luminaire module [590] further includes a PCB [505] having a first side including two contact elements [506 and 507], for example in the form of springs, soldered to it for making contact with the pads [401 and 402] from the AS-LED module [1] and a second side including wires [508 and 509] soldered to it for connecting to an external power source (e.g. remote LED driver [1000]). A thermal fuse [510] may be integrated into one wire [508]. An optional end caps [511] has external threads [512] that match the internal threads [513] of the cylindrical housing [500] at an opposing end from the AS-LED module [1]. Luminaire module [590] may further include an optional trim [514] that fits between, and is held in place by, cylindrical housing [500] and AS-LED module [1]. A plastic bracket for ceiling mount [515] holds the lightweight downlight luminaire module [590] in place when mounted for use.

Figure 6A:
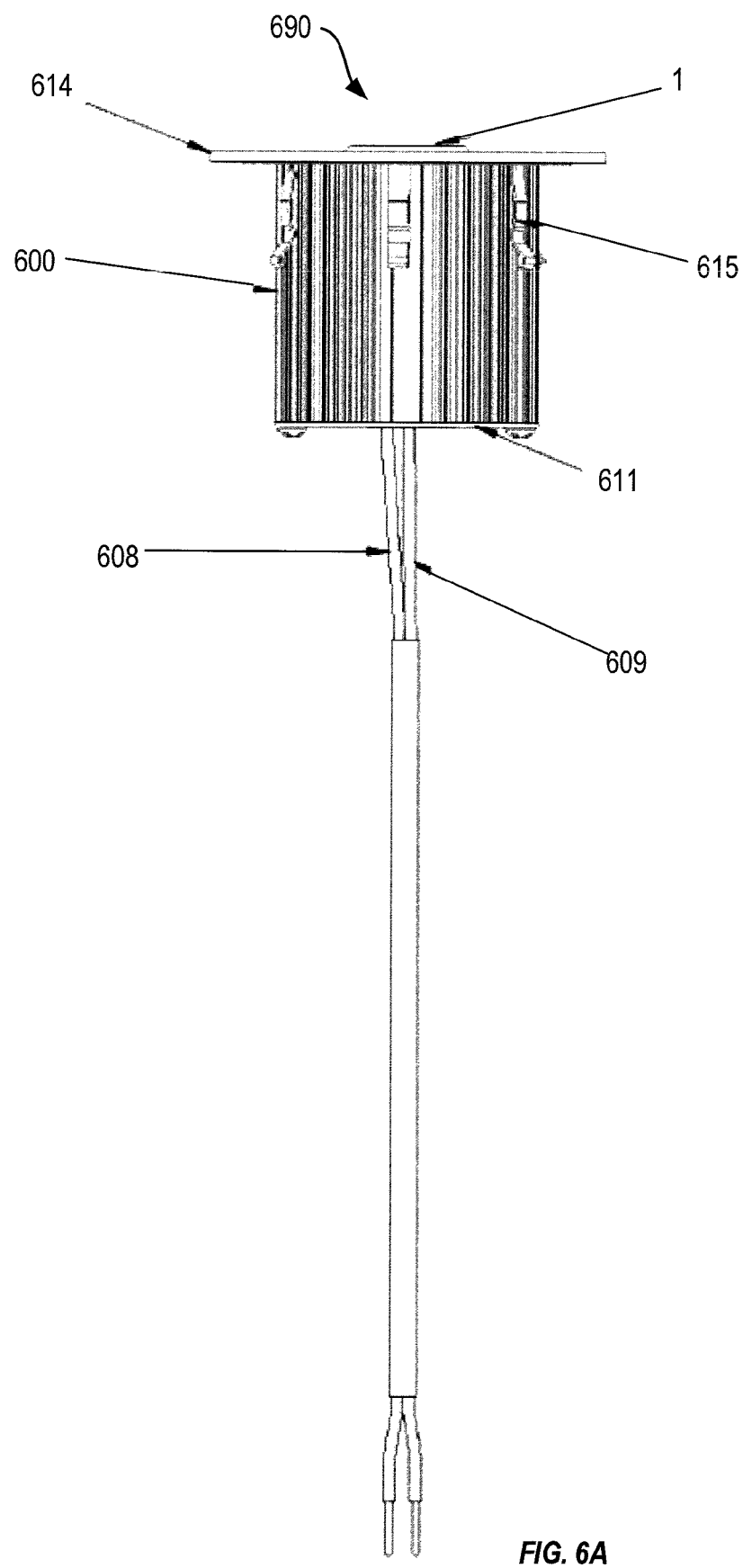
FIGS. 6A and 6B are perspective and exploded views of another exemplary LED downlight luminaire, respectively.
Figure 6B:
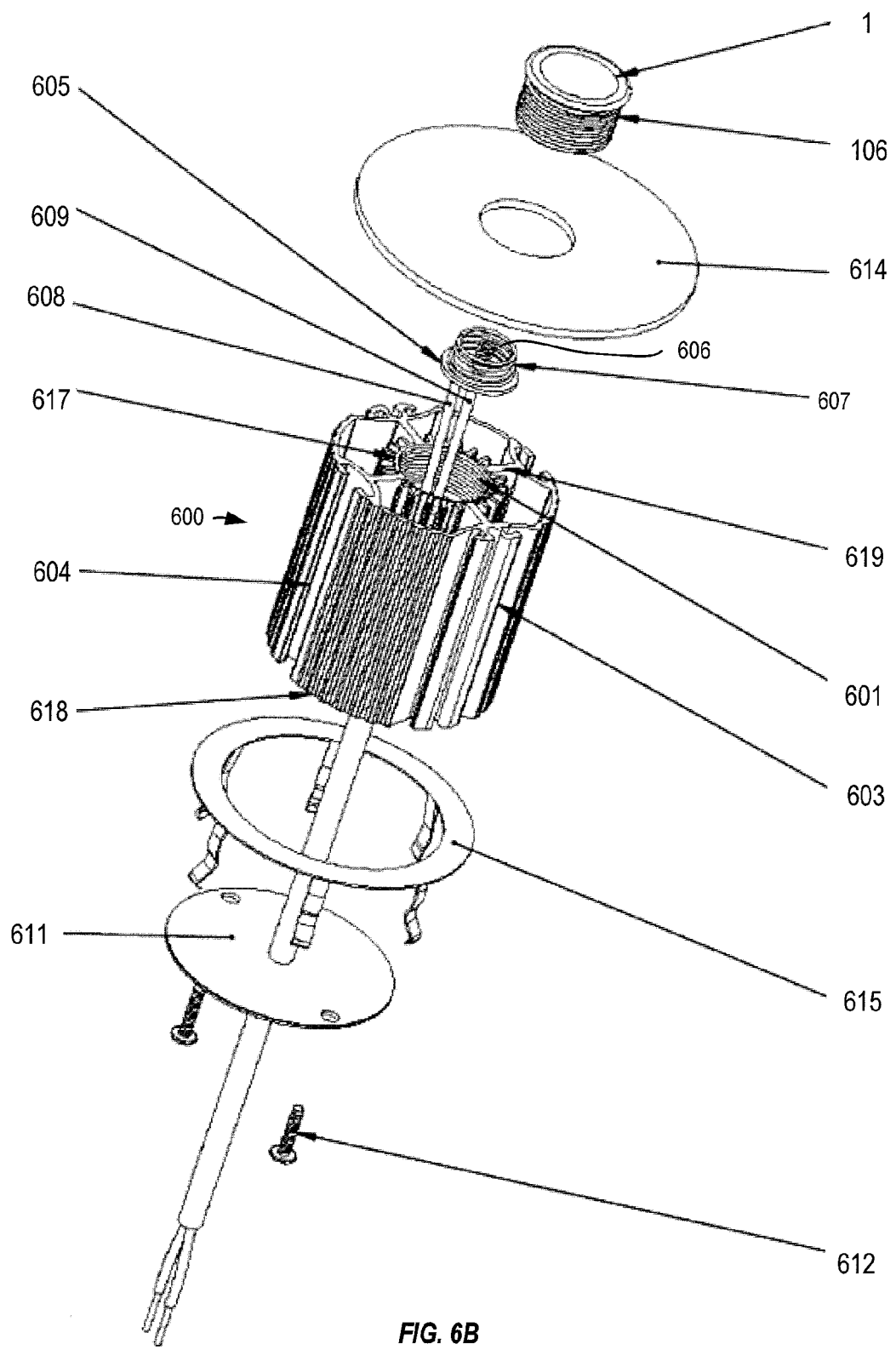

FIGS. 6A and 6B illustrate an example of a LED downlight luminaire module [690], in another embodiment, in perspective and exploded views, respectively. External threads [106] on the AS-LED module [1] match internal threading [601] of a fluted inner cylinder [617] of a cylindrical housing [600] of luminaire module [690]. Luminaire module [690] includes cylindrical housing [600] having a fluted outer cylinder [618] that connects to a fluted inner cylinder [617] through at least one axial support [619] to extend the heat sink. Optionally, the cylindrical housing [600] can have a pattern of flutes that act as a tongue [603] and groove [604] joint system between multiple luminaire housings. Luminaire module [690] further includes a PCB [605] having a first side including two contact elements (e.g. springs [606 and 607]) soldered to it for making contact with the pads [401 and 402] from the AS-LED module [1] and a second side including wires [608 and 609] soldered to it for connecting to an external power source (e.g. a remote LED driver). An optional end cap [611] may be attached to the cylindrical housing [600] through screws [612] or rivets at an opposing end from AS-LED module [1]. Luminaire module [690] may further include optional trim [614] which fits between, and is held in place by, cylindrical housing [600] and AS-LED module [1]. A metal bracket for ceiling mount [615] holds the lightweight downlight luminaire module [690] in place when mounted for use.

Figure 7A:
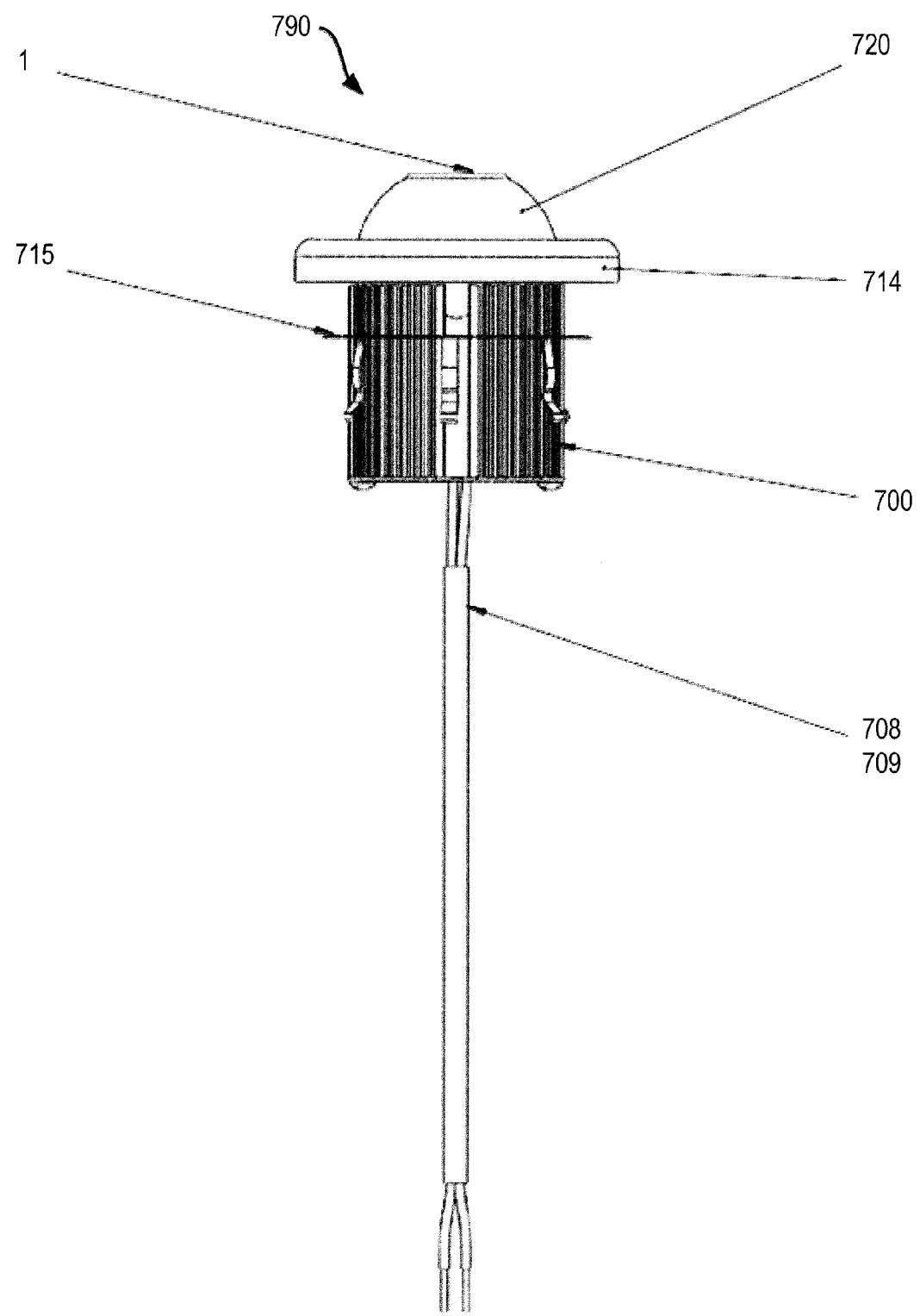
FIGS. 7A and 7B are perspective and exploded views of an exemplary adjustable LED downlight luminaire, respectively.
Figure 7B:
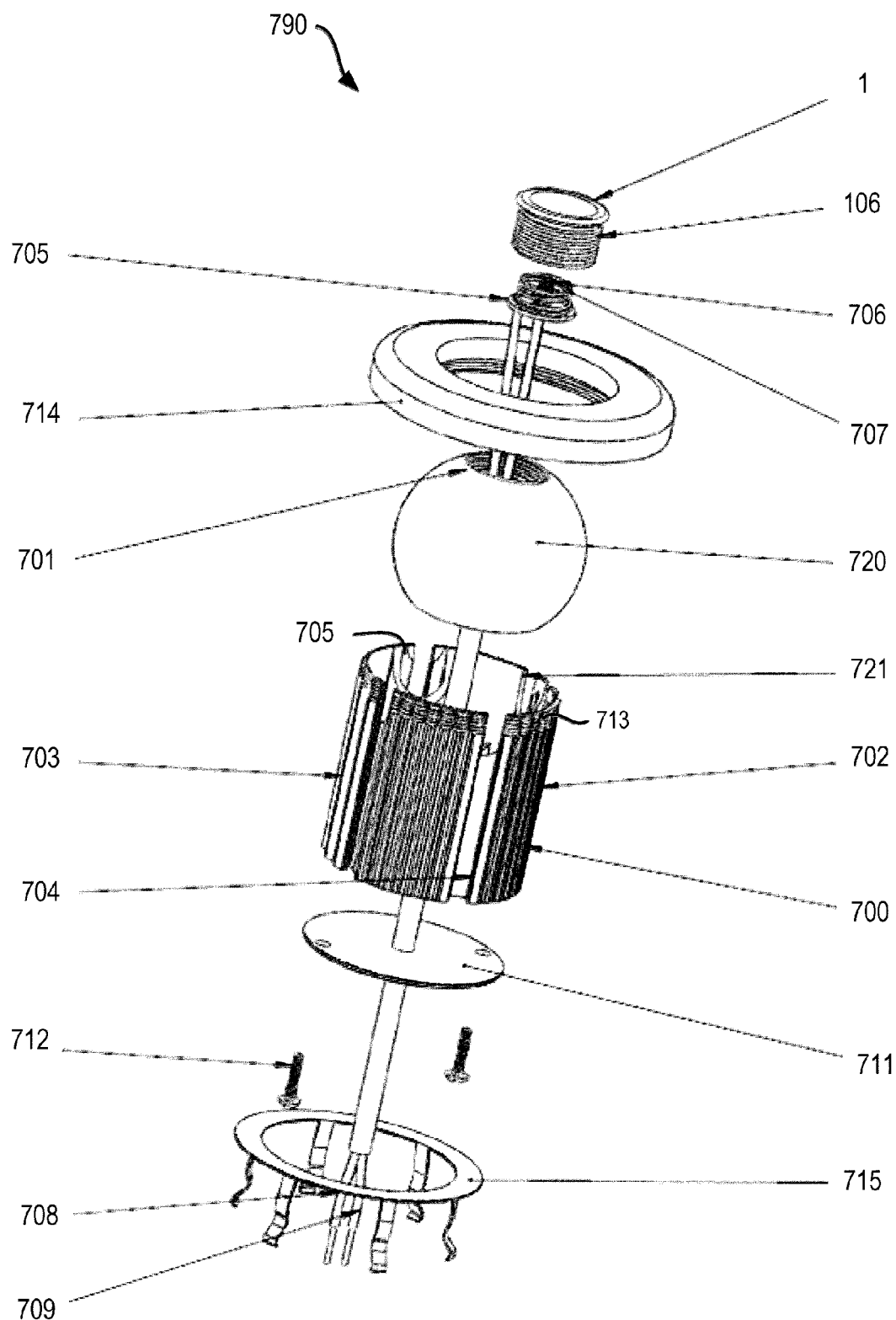

FIGS. 7A and 7B illustrate an example of an adjustable LED downlight luminaires, in one embodiment, in perspective and exploded views, respectively. External threads [106] on the AS-LED module [1] match an internal thread(s) [701] of a spherical housing [720]. Cylindrical housing [700] has a fluted outer cylinder [703] and an extruded inner cylinder [704]. Outer cylinder [703] is connected to inner cylinder [704] through axial supports [705]. The combination of outer cylinder [703] and inner cylinder [704] are shaped and sized to form a concave recess [721] which complements the spherical housing [720] to receive and make contact with spherical housing [720] while it rotates. Accordingly, spherical housing [720] is preferably always in direct contact with cylindrical housing [700] to promote efficient heat dissipation. Optionally, the cylindrical housing [700] can have a pattern of flutes [702] to further increase heat dissipation. A PCB [705] has a first side having two springs [706 and 707] soldered to it for making contact with the pads [401 and 402] from the AS-LED module [1] and a second side having wires [708 and 709] soldered to it for providing electrical connection from a power source (e.g. a remote LED driver). Similar to the above embodiments, one of wires [708 and 709] may include a thermal fuse. One of the optional end caps [711] attached to the cylindrical housing [700] through screws [712] at an opposing end from the spherical housing [720]. A trim [714] threads to an outer threads [713] of cylindrical housing [700] and over the spherical housing [720] that contains the AS-LED module [1]. A bracket for ceiling mount [715] holds the lightweight downlight luminaire in place.

Figure 8:
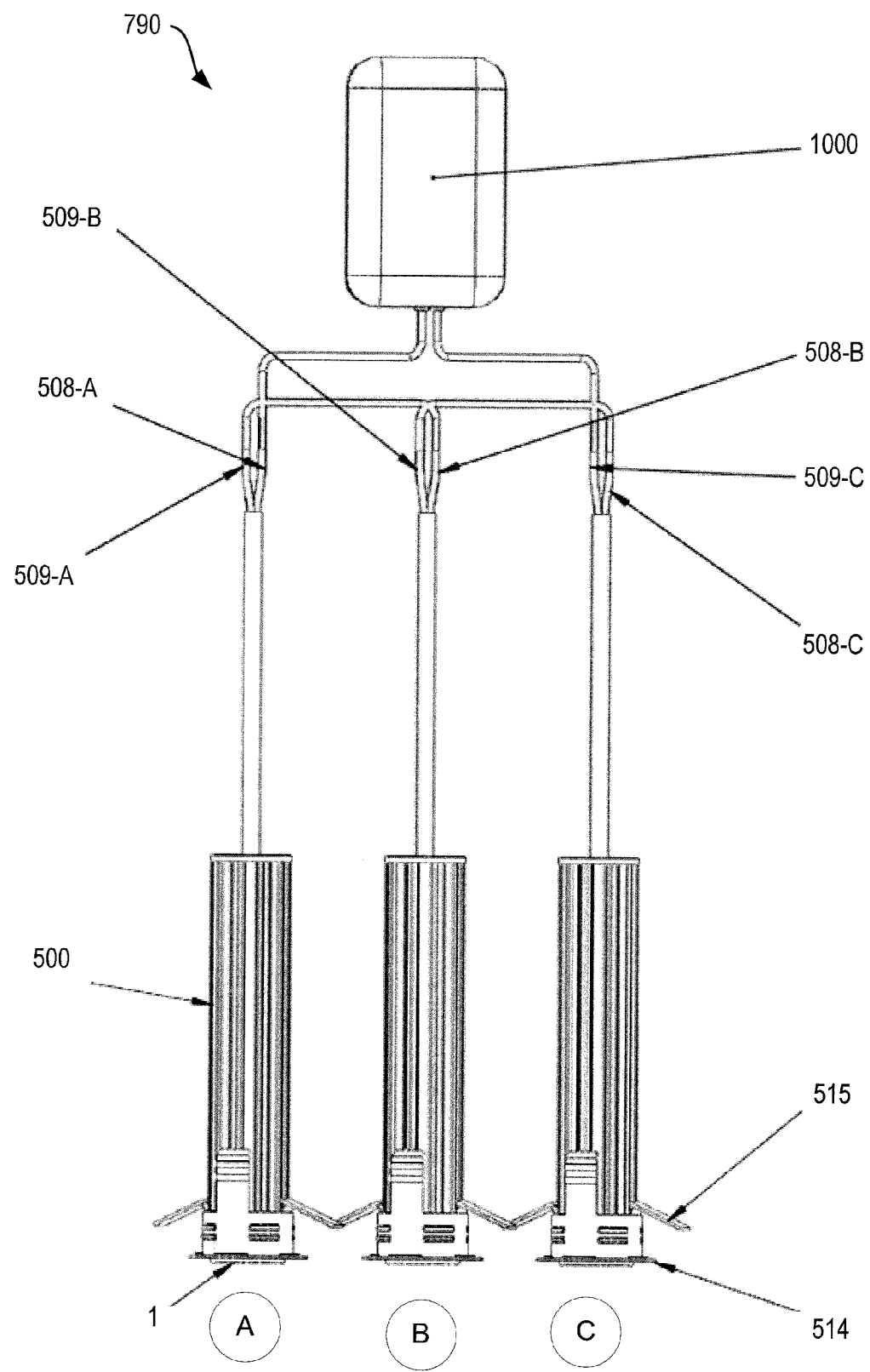
FIG. 8 is a perspective view of an exemplary layout for connecting three LED downlight Luminaires, in one embodiment.

FIG. 8 illustrates one configuration of an installation of multiple LED downlight luminaires [A]-[C]. Three fully assembled luminaires [A, B, and C] from FIGS. 5A and 5B are connected to the remote LED driver [1000]. It will be appreciated that any luminaire modules described above may be utilized in this, or other configurations. The three housings [500], three plastic brackets for ceiling mount [515], the three trim washers [514], and the three AS-LED modules [1] are visible on the fully assembled luminaires [A, B, and C]. Utilizing standard National Electrician's Code (hereafter, NEC) installation of connection wires and wire connections the wire [508-A] of the first assembled luminaire [A] is attached to the remote LED driver [1000] and the wire [509-A] is attached to the second assembled luminaire's [B] wire [508-B]. The second luminaire [B] has wire [508-B] attached to the wire [509-A] from the first assembled luminaire [A] and wire [509-B] attached to the wire [508-C] from the third assembled luminaire [C]. The third luminaire [C] has wire [508-C] attached to the wire [509-B] from the second assembled luminaire [B] and wire [509-C] attached to remote LED driver [1000]. Accordingly, the three luminaire modules are connected in series. It will be appreciated that these modules may alternatively be connected in parallel. The remote LED driver [1000] is housed in a standard NEC approved switch box to minimize the power loss by placing the remote LED driver [1000] closer to the three fully assembled luminaires [A, B, and C].

Combination of Features

Features described above as well as those claimed below may be combined in various ways without departing from the scope hereof. The following examples illustrate some exemplary combinations:

(A1) A luminaire module may include (1) a housing formed of extruded metal that is fluted and/or cylindrical; (2) an application-specific light emitting diode (AS-LED) module coupled to the housing having first and second sets of contact pads; and (3) a printed circuit board unit.

(B1) In the luminaire module described above in (A1), the printed circuit board unit may include (a) a first side including two sets of contact elements coupling to a respective one of the first sets and second sets of pads, and/or (b) a second side including a shunt protection device, and two wires coupled thereto, one of the two wires having a thermal fuse integrated therein.

(C1) In the luminaire module described above in (A1)-(B1), the luminaire module may further include a decorative trim inserted between the housing and the AS-LED module.

(D1) In the luminaire module described above in (A1)-(C1), the luminaire module may further include a bracket for ceiling mount.

(E1) In the luminaire module described above in (A1)-(D1), the luminaire module may further include a remote LED driver.

(F1) In the luminaire module described above in (A1)-(E1), the AS-LED module may include one or more of (a) a metal heat dissipation base having a reflecting recessed concave surface; (b) a submount mounted on the heat dissipation base; (c) a LED chip mounted on the submount and coupled with one or more metal pins, the metal pins being coupled to an AS-LED module PCB and passing through respective holes in the heat dissipation base; (d) an optical material disposed above the LED chip; and (e) an optical lens disposed on a step of the metal heat dissipation base proximate the bottom of the reflecting recessed concave surface.

(G1) In the luminaire module described above in (F1), the LED chip may include a plurality of LED chips mounted on the submount, each LED chip being mounted on a respective isolated area of the submount and being coupled to another of the LED chips via a coupling element.

(H1) In the luminaire module described above in (F1)-(G1), the submount may be formed from silicon.

(I1) In the luminaire module described above in (A1)-(H1), the housing may include a fluted outer cylinder and a fluted inner cylinder coupled thereto via a plurality of axial supports; wherein the AS-LED module couples to the fluted inner cylinder.

(J1) In the luminaire module described above in (I1), the fluted cylinder may be recessed.

(K1) In the luminaire module described above in (I1)-(J1), the luminaire module may further include a cap coupled to the fluted inner cylinder.

(L1) In the luminaire module described above in (I1)-(J1), the luminaire module may further include a cap coupled to the fluted outer cylinder.

(M1) In the luminaire module described above in (A1)-(H1), the housing may include (a) a rotatable spherical housing portion having internal threads, and, (b) an outer cylindrical housing portion coupled to an inner cylindrical portion via at least one axial support, wherein the combination of the outer and inner cylindrical portions are sized and shaped to form a concave recess which complements the spherical housing portion; wherein the AS-LED module is coupled to the internal threads of the spherical housing portion, and, the spherical housing portion continuously contacts the concave recess.

(N1) In the luminaire module described above in (M1), the luminaire module further including a decorative trim that couples to threading of the outer cylindrical housing portion over at least a portion of the spherical housing portion.

(O1) In the luminaire module described above in (M1)-(N1), the luminaire module may further include a cap coupled to the inner cylindrical portion.

(P1) In the luminaire module described above in (M1)-(N1), the luminaire module may further include a cap coupled to the outer cylindrical portion.

(Q1) In the luminaire module described above in (A1)-(H1), the luminaire module may further include a cap coupled the housing at an opposing end of the AS-LED module.

(R1) In the luminaire module described above in (A1)-(Q1), the housing may include vents that are in light with the flutes of the housing.

(S1) In the luminaire module described above in (A1)-(H1), the housing may include tongue and groove joints for coupling multiple downlight luminaire modules together.

(T1) In the luminaire module described above in (I1)-(J1), the fluted outer cylinder may include tongue and grove joints for coupling multiple luminaire modules together.

(U1) In the luminaire module described above in (M1)-(N1), the outer cylindrical portion may include tongue and grove joints for coupling multiple luminaire modules together.

(V1) In the luminaire module described above in (F1)-(U1), the heat dissipation base may include external threads.

(W1) In the luminaire module described above in (F1)-(V1), the AS-LED module may further include a sealed glass lens coupled to the reflector at a location different from the optical lens.

(X1) In the luminaire module described above in (F1)-(W1), the heat dissipation base may include a base portion wider than the reflecting recessed concave surface portion.

(Y1) In the luminaire module described above in (X1), the heat dissipation base further including a surrounding edge portion that is wider than the reflecting recessed concave portion.

(Z1) In the luminaire module described above in (D1)-(Y1), the bracket may include prongs for applying tension to a surrounding mounting medium such that the luminaire module is held in place.

(A2) In the luminaire module described above in (A1)-(Z1), further including multiple lighting modules of described in (A1)-(Z1) coupled together in series and/or parallel to form a lighting module.

(B2) In the lighting module described above in (A2), the multiple lighting modules being coupled together via tongue and groove joints on the housings of each of the multiple luminaire module.

Changes may be made in the above embodiments without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present system and method, which, as a matter of language, might be said to fall there between.

The invention claimed is:

1. A luminaire comprising:
   a light emitting diode (LED) module presenting a mounting surface on which a LED chip is located atop a submount inside a reflecting recessed area in a concave upper surface, and a second portion of the LED module comprising a metal heat-dissipation base, the base being coupled to and adapted to conduct heat into an end of a fluted substantially cylindrical extruded metal housing;
   the LED chip being electrically connected to one or more metal pins, the pins passing from the mounting surface through holes made through the heat dissipation base to be electrically connected to a printed circuit board (PCB) which is mounted on an opposite surface of the base;
   an optical material disposed above the LED chip; and,
   an optical lens disposed above the optical material.

2. The luminaire of claim 1, wherein the LED chip comprises a plurality of LED chips mounted on the submount, each LED chip being mounted on a respective isolated area of the submount and being coupled to another of the LED chips via a coupling element.

3. The luminaire of claim 1, the housing comprising a fluted outer cylinder and a fluted inner cylinder the fluted outer cylinder being integrated with the fluted inner cylinder via axial supports; wherein the LED module couples to the fluted inner cylinder.

4. The luminaire of claim 3, the fluted inner cylinder being recessed.

5. The luminaire of claim 3, wherein a fluted outer cylinder includes tongue and groove joints for coupling multiple luminaire modules together.

6. The luminaire of claim 3 wherein the fluted inner cylinder is located in a coaxial relationship within the fluted outer cylinder.

7. The luminaire of claim 1, wherein the housing is fluted and includes vents in line with the a plurality of flutes.

8. The luminaire of claim 1, wherein the housing includes tongue and groove joints for coupling multiple luminaire modules together.

9. The luminaire of claim 1, wherein the heat dissipation base includes external threads that engage with a set of reciprocating threads on the housing.

10. The luminaire of claim 9, the heat dissipation base further including a surrounding edge portion that is wider than the reflecting recessed concave portion.

11. The luminaire of claim 1, wherein the LED module further including a sealed glass lens coupled to the reflector at a location different from the optical lens.

12. The luminaire of claim 1, wherein the heat dissipation base has a base portion wider than the reflecting recessed concave surface portion.

13. The luminaire of claim 1, comprising:
   a bracket including prongs for applying tension to a surrounding mounting medium such that the luminaire is held in place.

14. The luminaire of claim 1, wherein tongue and groove joints on the housing are used to connect the luminaire to another substantially identically configured luminaire.

15. The luminaire of claim 1 wherein the LED module is configured to operate along with a remote driver.

16. The luminaire of claim 1 configured to be coupled together with a plurality of other substantially similar modules in one of series or parallel.

17. The luminaire of claim 1 wherein the housing is extruded from a single piece of metal.

18. A luminaire comprising:
   a housing including a rotatable spherical housing portion having internal threads, and,
   an outer cylindrical housing portion coupled to an inner cylindrical portion via at least one axial support, wherein the combination of the outer and inner cylindrical portions are sized and shaped to form a concave recess which complements the spherical housing portion;
   wherein:
   a group of external threads on a light emitting diode (LED) module are coupled to the internal threads of the spherical housing portion, the LED module having a metal heat-dissipation base, the base having a reflecting, recessed, surface;
   a LED chip on a submount secured on the surface using metal pins, the pins passing through holes made through the heat dissipation base to be electrically connected to a printed circuit board (PCB) existing on another side of the base and,
   the spherical housing portion continuously contacts the concave recess.

19. The luminaire of claim 18, wherein a decorative trim couples to threading of the outer cylindrical housing portion over at least a portion of the spherical housing portion.

20. The luminaire of claim 18, further comprising a cap coupled to the inner cylindrical portion.

21. The luminaire of claim 18, further comprising a cap coupled to the outer cylindrical portion.

22. The luminaire of claim 18, the outer cylindrical portion including tongue and groove joints for coupling multiple luminaire modules together.

23. A lighting system comprising:
a first lighting unit comprising an LED module which can be coupled together with a generally-cylindrical, elongated extruded metal housing which, when installed in an aperture formed in a structure, the structure having a first exposed side, and a second opposite side;
first and second electrical conduits enabling an electrical connection between the LED module and a power source when the module and housing are installed the electrical conduits further enabling physical securement of the LED module and a printed circuit board located on the opposite side; and
a heat-conductive portion of the module together with the generally-cylindrical housing forming a heat sink which extends through the aperture a distance greater than the diameter of the aperture and conducts heat out of the opposite side of the structure.

24. The system of claim 23 wherein one of said first and second conduits are used to make a series or parallel connection to at least one other lighting unit, wherein the other lighting unit is substantially the same as the first unit, and wherein the housings on the first and other units each are configured to enable the physical coupling of the first unit to the second unit.

25. The system of claim 24 wherein the first and other unit housings are coupled together via tongue and groove joints formed on each.

26. The system of claim 23 wherein the housing includes a plurality of longitudinally extending ribs.

27. The system of claim 23 wherein the overall appearance of the lighting unit is fluted.

\* \* \* \* \*